(12) United States Patent
Connell

(10) Patent No.: US 10,573,477 B2
(45) Date of Patent: Feb. 25, 2020

(54) ELECTRICAL CONTACT SWITCH, ELECTRICAL CONTACTOR AND METHOD OF PREVENTING OR INHIBITING CONTACT BOUNCE OF ELECTRICAL CONTACTOR

(71) Applicant: Johnson Electric S.A., Murten (CH)

(72) Inventor: Richard Anthony Connell, Cambridge, GA (US)

(73) Assignee: JOHNSON ELECTRIC INTERNATIONAL AG, Murten (CH)

( * ) Notice: Subject to any disclaimer, the term of this patent is extended or adjusted under 35 U.S.C. 154(b) by 646 days.

(21) Appl. No.: 15/295,038

(22) Filed: Oct. 17, 2016

(65) Prior Publication Data

US 2017/0110276 A1    Apr. 20, 2017

(30) Foreign Application Priority Data

Oct. 16, 2015    (GB) .................................. 1518367.6

(51) Int. Cl.
*H01H 50/60* (2006.01)
*H01H 50/64* (2006.01)
(Continued)

(52) U.S. Cl.
CPC .............. *H01H 50/60* (2013.01); *H01H 1/54* (2013.01); *H01H 50/20* (2013.01); *H01H 50/58* (2013.01);
(Continued)

(58) Field of Classification Search
CPC .......... H01H 50/60; H01H 1/54; H01H 50/20; H01H 50/58
See application file for complete search history.

(56) References Cited

U.S. PATENT DOCUMENTS 6,046,661 A * 4/2000 Reger ................... H01H 50/56
335/185
6,714,108 B1    3/2004 Simms et al.
(Continued)

FOREIGN PATENT DOCUMENTS

DE    1929091 U    12/1965
EP    2613161 A1    7/2013

*Primary Examiner* — Bernard Rojas
(74) *Attorney, Agent, or Firm* — Muncy, Geissler, Olds & Lowe, P.C.

(57) ABSTRACT

An electrical contact switch for use in an electrical contactor, which comprises first and second electrical terminals, an electrically-conductive busbar in electrical communication with the first electrical terminal, and at least one fixed electrical contact which is attached to the electrically-conductive busbar. The switch also has an electrically-conductive moveable arm in electrical communication with the second electrical terminal, with at least one moveable electrical contact which is attached to the electrically-conductive moveable arm to form an electrical contact set with the fixed electrical contact. A fixed ferromagnetic element is positioned at or adjacent to a side of the electrically-conductive moveable arm proximate the second electrical terminal, and a moveable ferromagnetic element is provided in physical communication with a side of the electrically-conductive moveable arm which is opposite to the fixed ferromagnetic element. In a closed condition of the electrical contact set, the electrically-conductive moveable arm induces a magnetic field in the fixed and moveable ferromagnetic elements, and thus the moveable ferromagnetic element is magnetically attracted towards the fixed ferromagnetic element to thereby increase a contact pressure on the electrical contact set. An electrical contactor and method of preventing or inhibiting contact bounce of an electrical contactor are also provided.

16 Claims, 6 Drawing Sheets

(51) Int. Cl.
  *H01H 1/54*    (2006.01)
  *H01H 50/58*   (2006.01)
  *H01H 50/20*   (2006.01)
  *H01H 1/26*        (2006.01)
  *G01R 11/02*       (2006.01)
  *H01H 9/38*        (2006.01)

(52) U.S. Cl.
  CPC ............ *G01R 11/02* (2013.01); *H01H 1/26* (2013.01); *H01H 9/38* (2013.01); *H01H 50/642* (2013.01)

(56) References Cited

U.S. PATENT DOCUMENTS

| | | | | |
|---|---|---|---|---|
| 2008/0012665 A1* | 1/2008 | DeBoer | ............... | H01H 1/54 335/16 |
| 2009/0318000 A1* | 12/2009 | Connell | ............... | H01H 1/54 439/251 |
| 2013/0098744 A1* | 4/2013 | Therrien | ............... | H01H 1/26 200/52 R |
| 2015/0015348 A1 | 1/2015 | Connell | | |
| 2017/0110277 A1* | 4/2017 | Connell | ............... | H01H 51/00 |

* cited by examiner

ELECTRICAL CONTACT SWITCH, ELECTRICAL CONTACTOR AND METHOD OF PREVENTING OR INHIBITING CONTACT BOUNCE OF ELECTRICAL CONTACTOR

CROSS REFERENCE TO RELATED APPLICATIONS

This non-provisional patent application claims priority under 35 U.S.C. § 119(a) from Patent Application 1518367.6 filed in Britain on Oct. 16, 2015.

FIELD OF THE INVENTION

The present invention relates to an electrical contact switch for use with an electrical contactor, such as those used in electricity meters. The invention further relates to an electrical contactor having such a switch, and to a method of limiting contact bounce using such a switch.

BACKGROUND OF THE INVENTION

Electrical contactors are utilised to provide a load-disconnect function in modern electricity meters, for applications such as split-phase domestic supply. A basic meter, which has an internally-mounted electrical contactor, is pluggable into a cabled utility-owned meter-base socket for ease of installation and removal. The cables and sprung jaws thereof are typically sized for delivering a 200 Amps current supply.

At the nominal 200 Amps level, the meter contactor is expected to be capable of performing a minimum number of on/off switching-cycle operations, typically 5000 of each, throughout their endurance life. This must be successfully performed without the contacts burning or welding together, when driven by the main meter circuit, for the desired on/off disconnect sequence.

According to the ANSI C12.1 specification, for a two-pole contactor, during a moderate short-circuit fault, whilst current-carrying and in the contacts-closed condition, of 5.0 kA rms, for a maximum duration of 6 full supply cycles, the contacts must not weld, and the contactor is expected to operate and disconnect both phases of the load normally, on following solenoid-driven pulses.

Similarly, according to the ANSI C12.1 specification, during a dead short fault, whilst current-carrying and in the contacts-closed condition, of 12 kA rms, for a maximum duration of 4 full supply cycles, the contacts must weld safely. This means that both of the phase switches must remain closed, must not explode, rupture or emit dangerous molten metal, and must remain intact within the meter, with no danger to nearby persons.

SUMMARY OF THE INVENTION

The present invention seeks to provide solutions to provide an improved electrical contact switch which fulfils the above-mentioned restriction criteria.

According to a first aspect of the invention, there is provided an electrical contact switch for use in an electrical contactor, the electrical contact switch comprising: first and second electrical terminals; an electrically-conductive busbar in electrical communication with the first electrical terminal; at least one fixed electrical contact which is attached to the electrically-conductive busbar; an electrically-conductive moveable arm in electrical communication with the second electrical terminal; at least one moveable electrical contact which is attached to the electrically-conductive moveable arm to form an electrical contact set with the fixed electrical contact; a fixed ferromagnetic element positioned at or adjacent to a side of the electrically-conductive moveable arm proximate the second electrical terminal; and a moveable ferromagnetic element in physical communication with a side of the electrically-conductive moveable arm which is opposite to the fixed ferromagnetic element; wherein, in a closed condition of the electrical contact set, the electrically-conductive moveable arm induces a magnetic field in the fixed and moveable ferromagnetic elements, the moveable ferromagnetic element being magnetically attracted towards the fixed ferromagnetic element to thereby increase a contact pressure on the electrical contact set.

By providing fixed and moveable ferromagnetic elements which are mutually attracted to one another in a closed condition of the electrical contact switch as a result of induced magnetic forces generated therein, it becomes possible to utilise the moveable ferromagnetic element to apply an additional contact pressure to the moveable arm of the electrical contact switch. This beneficially inhibits contact bounce of the electrical contact set, thereby limiting the deleterious effects of electrical arcing on the contacts which might otherwise reduce the working lifespan or safe operation of the electrical contact switch.

The moveable ferromagnetic element may include a projection facing the electrically-conductive moveable arm to effect physical contact therebetween, in which case the projection may be positioned at or adjacent to a point on the moveable ferromagnetic element of maximum attraction to the fixed ferromagnetic element in the said closed condition of the electrical contact set. In a preferred embodiment, the moveable ferromagnetic element and/or fixed ferromagnetic element may be formed as a steel plate.

The steel plates described in detail below have several specific advantages. The projection on the main body portion of the moveable steel plate is positioned at a maximum point of magnetic attraction with the fixed steel plate, which in turn allows a maximum force transfer to be applied to the moveable arm. This advantageously ensures that the maximum contact pressure is applied to the contact set, rather than being spread across the whole area of the moveable arm.

The electrically-conductive moveable arm may be biased such that the or each moveable electrical contact is in contact with the or each fixed electrical contact in the absence of external forces.

Biasing of the moveable arm advantageously limits the propensity of contact bounce occurring in the electrical contact switch, ensuring a cleaner snap shut of the switch into the closed condition. This additionally improves the working lifetime of the electrical contact switch.

Preferably, the electrically-conductive moveable arm may be positioned at an acute angle to the fixed ferromagnetic element and/or to a main body portion of the moveable ferromagnetic element.

The angular arrangement of the fixed and moveable ferromagnetic elements, and the moveable arm, ensures that the strongest magnetic interaction between the fixed and moveable ferromagnetic elements is achieved whilst minimally impacting the allowable trajectory of the moveable arm. This beneficially maintains clean opening and closing of the switch, thereby avoiding undesirable short-circuiting of the electrical contact switches.

Optionally, the electrically-conductive moveable arm may have a split-blade arrangement, having at least two blades, each blade having one said moveable electrical contact thereon, the bulbar having a corresponding plurality of fixed electrical contacts thereon. At least one of the said blades of the electrically-conductive moveable aim may be a lead blade and at least one of the said blades of the electrically-conductive moveable arm is a lag blade, wherein the or each lead blade is adapted such that the moveable electrical contact associated therewith makes contact with the corresponding fixed electrical contact before the moveable electrical contact associated with the or each lag blade. In a preferable embodiment, the electrically-conductive moveable arm may include one said lead blade and two said lag blades.

A lead-lag blade arrangement beneficially allows for the initial current-carrying at contact closure to be conducted solely by the lead blade. A relatively large lead contact set can be provided in order to avoid tack welding as a result. Once the lead blade has made the connection, however, the risk of tack welding is minimised, and therefore the contact size, and therefore precious metal requirements, for the lag blades is substantially reduced. The split-blade arrangement then beneficially allows for current-sharing across the three blades, minimising the potential for electrical arcing, which is proportional to the carried current.

According to a second aspect of the invention, there is provided an electrical contactor comprising: at least one electrical contact switch preferably in accordance with the first aspect of the invention; and an actuation means arranged to actuate the electrically-conductive moveable arm of the or each electrical contact switch between open and closed conditions.

An electrical contactor utilising the electrical contact switch as described is beneficially able to meet the necessary safety requirements under moderate short circuit and/or dead fault conditions, whilst also reducing the precious metal requirements of the manufacture of such a contactor.

Preferably, the actuation means may include a switch-arm engagement element associated with the electrically-conductive moveable arm of the or each electrical contact switch, and an electromagnetically operable actuator to actuate the or each switch-arm engagement element. The or each switch-arm engagement element may have a shaped engagement surface to impart a lead-lag opening and closing actuation onto the or each electrically-conductive moveable arm. Furthermore, the or each switch-arm engagement element may be a sliding lifter having a plurality of engagement protrusions of different depth to form the shaped engagement surface.

Such an actuator acts to gently push the moveable arm out of the closed condition, resulting in a reduction in the likelihood of arcing occurring, and substantially increasing the working life expectancy of the contactor.

Preferably, the actuation means may be a normally-closed actuation means.

By providing a normally-closed actuation means, the rest condition of the electrical contactor is closed, ensuring that there is not a propensity for the electrical contact sets to be biased towards opening. This advantageously reduces the contact pressure required to maintain the switches in a closed condition, thereby reducing the likelihood of contact bounce and arcing effects.

According to a third aspect of the invention, there is provided a method of preventing or inhibiting contact bounce of an electrical contactor, the method comprising the steps of: a] providing an electrical contact switch, preferably in accordance with the first aspect of the invention; b] actuating the electrically-conductive moveable arm such that the or each moveable electrical contact is brought into a closed condition with the fixed electrical contact; and c] providing an electrical current through the electrically-conductive moveable arm so as to induce a magnetic field in the fixed and moveable ferromagnetic elements, such that the moveable ferromagnetic element is attracted towards the fixed ferromagnetic element, the moveable ferromagnetic element thereby applying a physical closure force to the electrically-conductive moveable arm to prevent or inhibit bouncing of the or each moveable electrical contact.

BRIEF DESCRIPTION OF THE DRAWINGS

The invention will now be more particularly described, by way of example only, with reference to the accompanying drawings, in which.

DETAILED DESCRIPTION OF THE PREFERRED EMBODIMENTS

Figure 1:
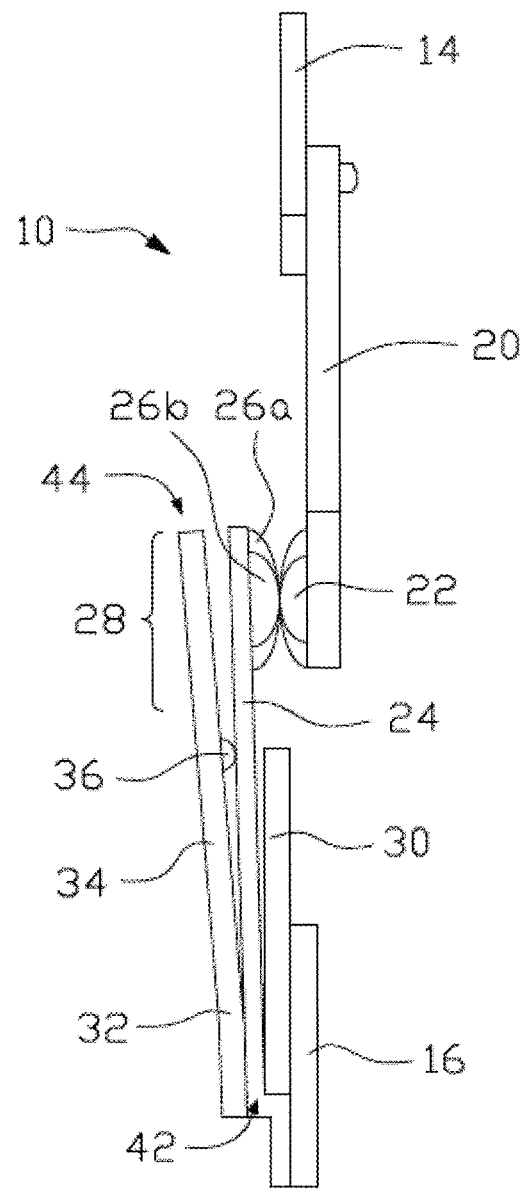
FIG. 1 shows a front representation of one embodiment of an electrical contact switch in accordance with the first aspect of the invention.
Figure 2:
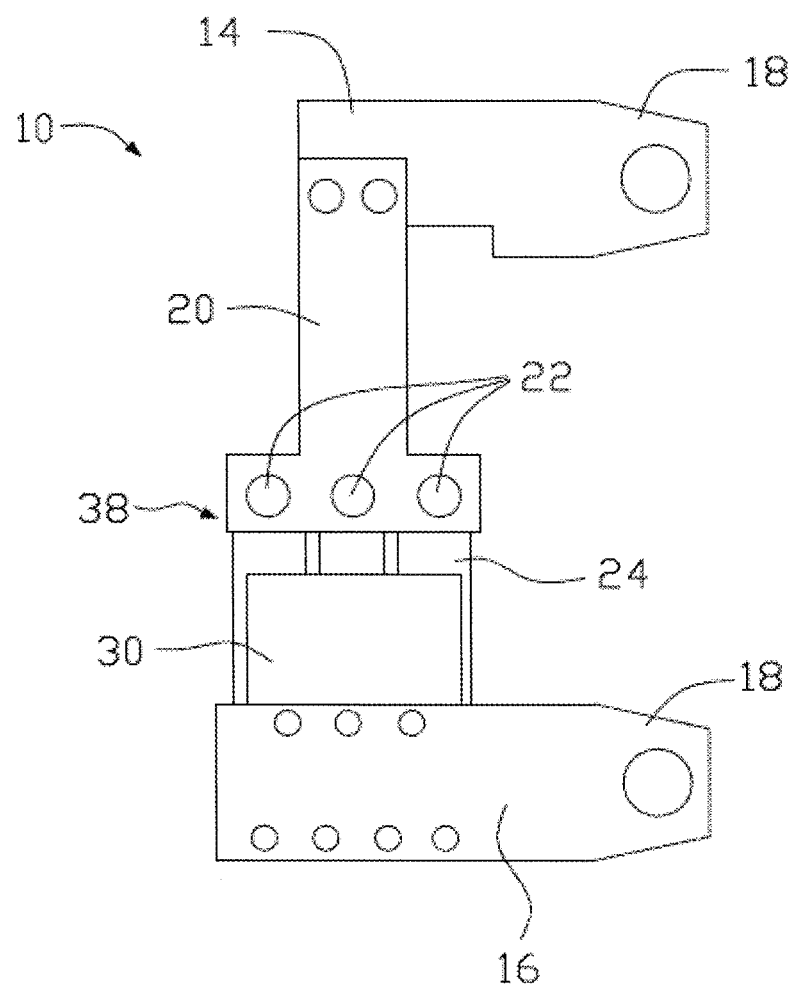
FIG. 2 shows a side representation of the electrical contact switch of FIG. 1.
Figure 4A:
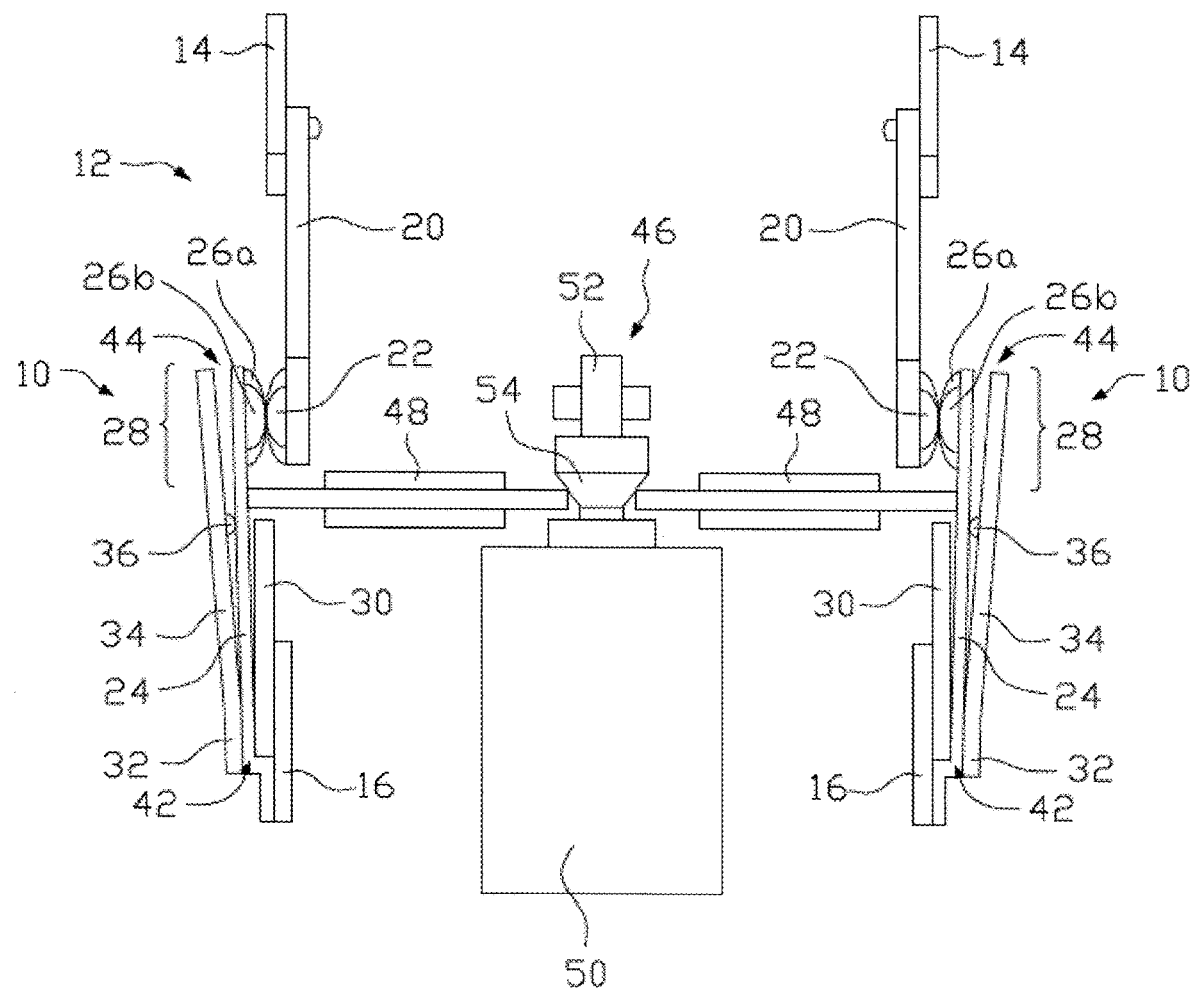
FIG. 4a shows a front representation of one embodiment of an electrical contactor in accordance with the second aspect of the invention, illustrating a contacts-closed condition of the electrical contactor.
Figure 4B:
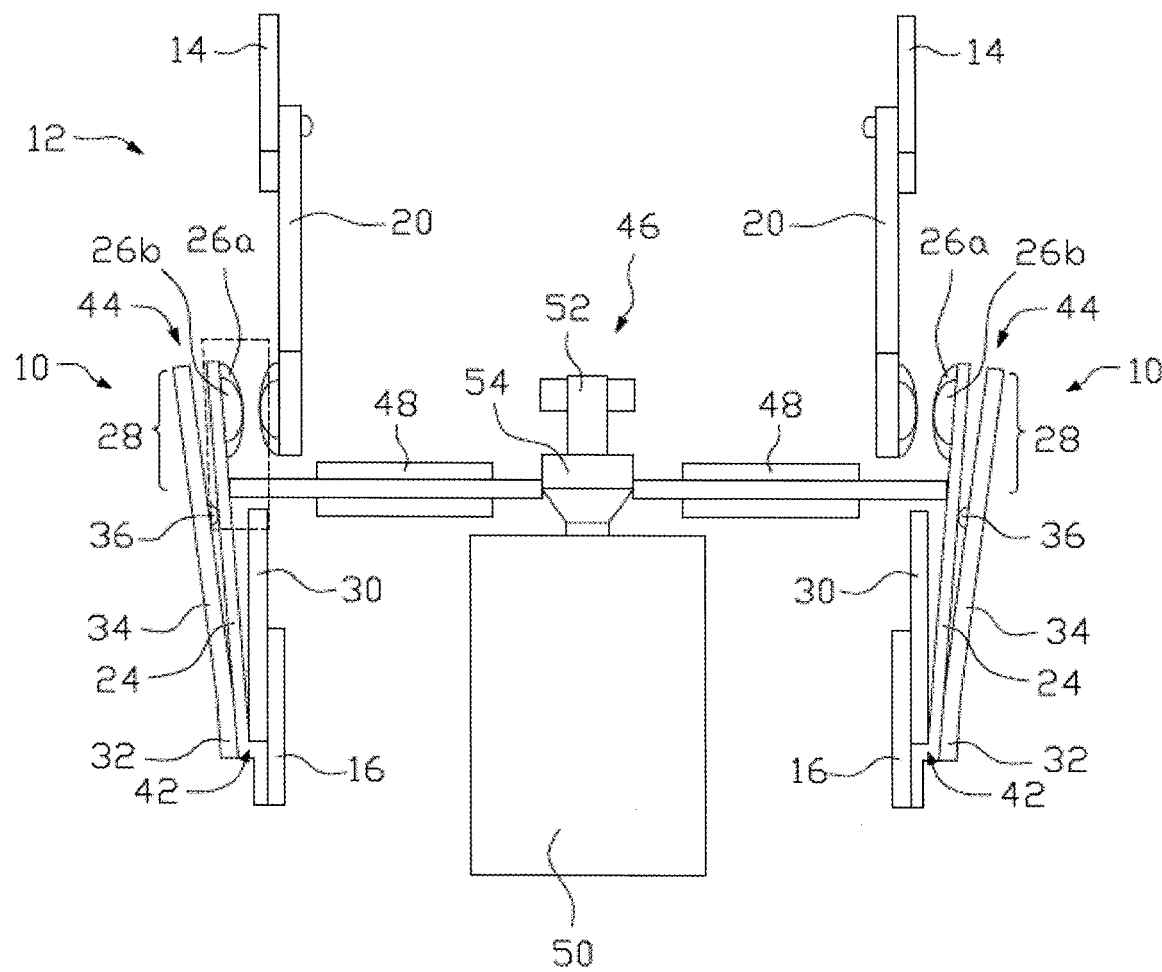
FIG. 4b shows a front representation of the electrical contactor of FIG. 4a in a contacts-open condition.

Referring firstly to FIGS. 1 and 2, there is illustrated an electrical contact switch, indicated globally as 10 for use as part of an electrical contactor, such as that illustrated in FIGS. 4a and 4b at 12.

The electrical contact switch 10 comprises first and second electrical terminals 14, 16, which, for simple installation into an electrical contactor 12, may be provided in connection with electrically-conductive stabs 18, as best illustrated in FIG. 2. In electrical communication with the first terminal 14 is a fixed electrically-conductive busbar 20, to which is attached at least one fixed electrical contact 22. Three such fixed contacts 22 are illustrated in the depicted embodiment, but it will be apparent that any known contact arrangement could readily be provided with the present invention, and the depicted contact arrangement is used by way of example only.

There is, provided in electrical communication with the second terminal 16, an electrically-conductive moveable arm 24, to which is mounted at least one moveable electrical contact 26a, 26b. A more detailed representation of the present embodiment of the electrically-conductive moveable arm 24 can be seen in FIG. 3. A complementary set of moveable electrical contacts 26a, 26b is provided to form a contact set 28 with the fixed electrical contacts 22. In the present embodiment, the moveable electrical contacts are provided as one lead moveable electrical contact 26a and two lag electrical contacts 26b, and the characteristics of this contact arrangement will be discussed in more detail when discussing the electrical contactor 12 in more detail.

There is also provided a fixed ferromagnetic element, which is here provided as a fixed steel plate 30, at or adjacent to one side of the electrically-conductive moveable arm 24 which is proximate the second electrical terminal 16. In the depicted embodiment, the fixed steel plate 30 is riveted to the second electrical terminal 16, with the electrically-conductive moveable arm 24 being riveted to the second electrical terminal 16 so as to be positioned at an acute angle to the fixed steel plate 30. This positions the fixed steel plate 30 between the second terminal 16 and the electrically-conductive moveable arm 24, though the exact positioning of the fixed steel plate 30 could be amended slightly; for instance, the fixed steel plate 30 and second terminal 16 could be completely coplanar, by welding the two together.

On the opposite side of the electrically-conductive moveable arm 24 is positioned a moveable ferromagnetic element, here provided as a moveable steel plate 32 having a main plate body 34 and a ridge, bump, protrusion or similar plate projection 36 extending from the main plate body 34 towards the electrically-conductive moveable arm 24. The moveable steel plate 32 is affixed to the second electrical terminal 16 and/or the electrically-conductive moveable arm 24 such that the main plate body 34 is at an acute angle to the electrically-conductive moveable arm 24, but such that the plate projection 36 is in physical contact with the electrically-conductive moveable arm 24.

The busbar 20 is, in the depicted embodiment, formed so as to have a T-shaped profile, with the fixed electrical contacts 22 being provided on the bridge 38 of the T-shape. This minimises the material requirements of the busbar 20 whilst maximising the available space for the contacts 22. Typically, the busbar 20 will be formed from an electrically conductive material such as brass, copper or potentially even steel, for example, as will be the first and second terminals 14, 16, whereas the stabs 18 will be formed from a highly electrically-conductive material such as copper. Alternative materials available for the construction of these components will be apparent to the skilled person, however.

Whilst the fixed and moveable steel plates 30, 32 are here presented as being formed from steel, the important feature of these elements is that a magnetic field can be induced therein. As such, any appropriate ferromagnetic material could be used, typically a soft ferromagnetic material such as iron, steel, cobalt, nickel or alloys thereof; soft here referring to the degree of ferromagnetism, rather than the hardness.

Figure 3:
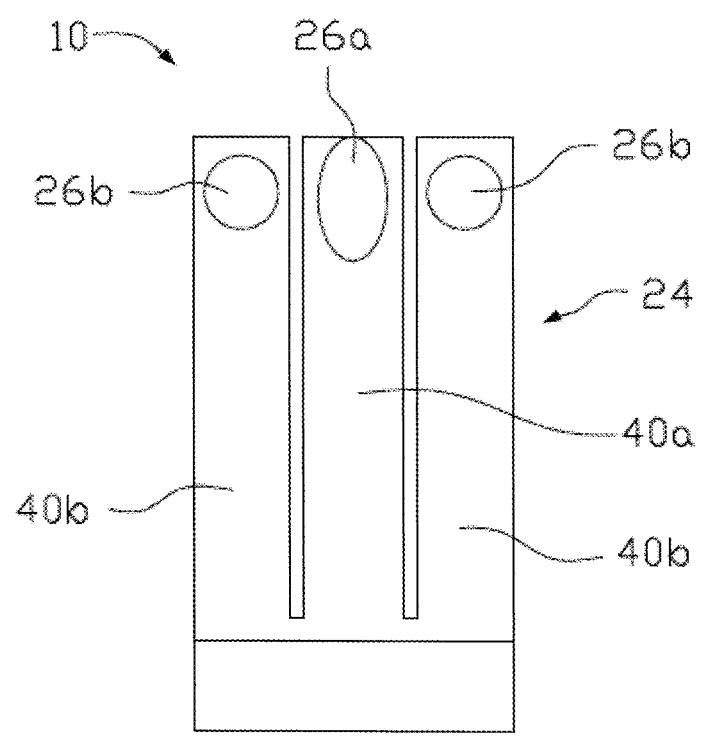
FIG. 3 shows a side representation of one embodiment of the electrically-conductive moveable arm of the electrical contact switch of FIG. 1.

The electrically-conductive moveable arm 24 is, as shown in FIG. 3, formed as a split-blade aim, having one lead blade 40a and two lag blades 40b, to which the lead and lag moveable electrical contacts 26a, 26b are mounted. Typically, the electrically-conductive moveable arm 24 will be formed from a relatively thin electrically-conductive material having a degree of flexion therein. Commonly, this would be a thin plate of copper, preferably spring-grade copper. In the absence of external forces, the mounting of the electrically-conductive moveable arm 24 means that the flexion naturally urges the moveable electrical contacts 26a, 26b towards the fixed electrical contacts 22. As such, the electrical contact switch 10 is naturally biased towards a closed condition.

When a current is applied through the electrical contact switch 10, by respectively connecting the first and second terminals 14, 16 to a circuit, the current will flow through the electrically-conductive moveable arm 24. The applied current will result in an instant magnetic field to be generated around the electrically-conductive moveable arm 24. This induces a magnetic field in each of the fixed and moveable steel plates 30, 32, the polarization of the respective magnetic fields being attractive to one another.

Since the fixed steel plate 30 is physically prevented from moving, the moveable steel plate 32 will be urged towards the fixed steel plate 30 as a result of this magnetic attraction. As the moveable steel plate 32 is cantilevered about the pivot point 42 where it is connected to the electrically-conductive moveable aim 24 and/or second terminal 16, the force of the attraction is exerted at a distal, free end 44 of the moveable steel plate 32. This free end 44 is closest to the moveable electrical contacts 26a, 26b, and therefore the urging of the moveable steel plate 32 results in a force being applied to the electrically-conductive moveable arm 24 through the plate projection 36 and therefore results in a more secure contact between the moveable and fixed contacts 26a, 26b, 22 of the contact set 28.

This arrangement of electrical contact switch 10 becomes more relevant when applied to an electrical contactor 12, however, where the electrically-conductive moveable arm 24 is regularly actuated between open and closed conditions. This is explored in more detail in FIGS. 4a to 4c.

FIG. 4a shows a two-pole electrical contactor 12, having two electrical contact switches 10 as previously described, in its closed configuration. The electrical contactor 12 includes an actuation means, which is here illustrated as an electromagnetic actuator 46, having two switch arm engagement elements, formed here as sliding lifters 48.

The actuator 46 is formed having a solenoid 50 with a moveable plunger 52. The plunger 52 has a shaped cam surface 54 which is in contact with the sliding lifters 48. In the closed configuration of FIG. 4a, the solenoid 50 is not energised, and the plunger 52 is in an ejected condition. When in the ejected condition, the cam surface 54 is at its narrowest, meaning that the sliding lifters 48 are urged into their retracted condition relative to the electrically-conductive moveable arms 24 of the electrical contact switches 10.

In the absence of any force provided on the electrically-conductive moveable arms 24 by the sliding lifters 48, the contact sets 28 will be closed, and current will pass through the electrical contact switches 10.

Figure 4C:
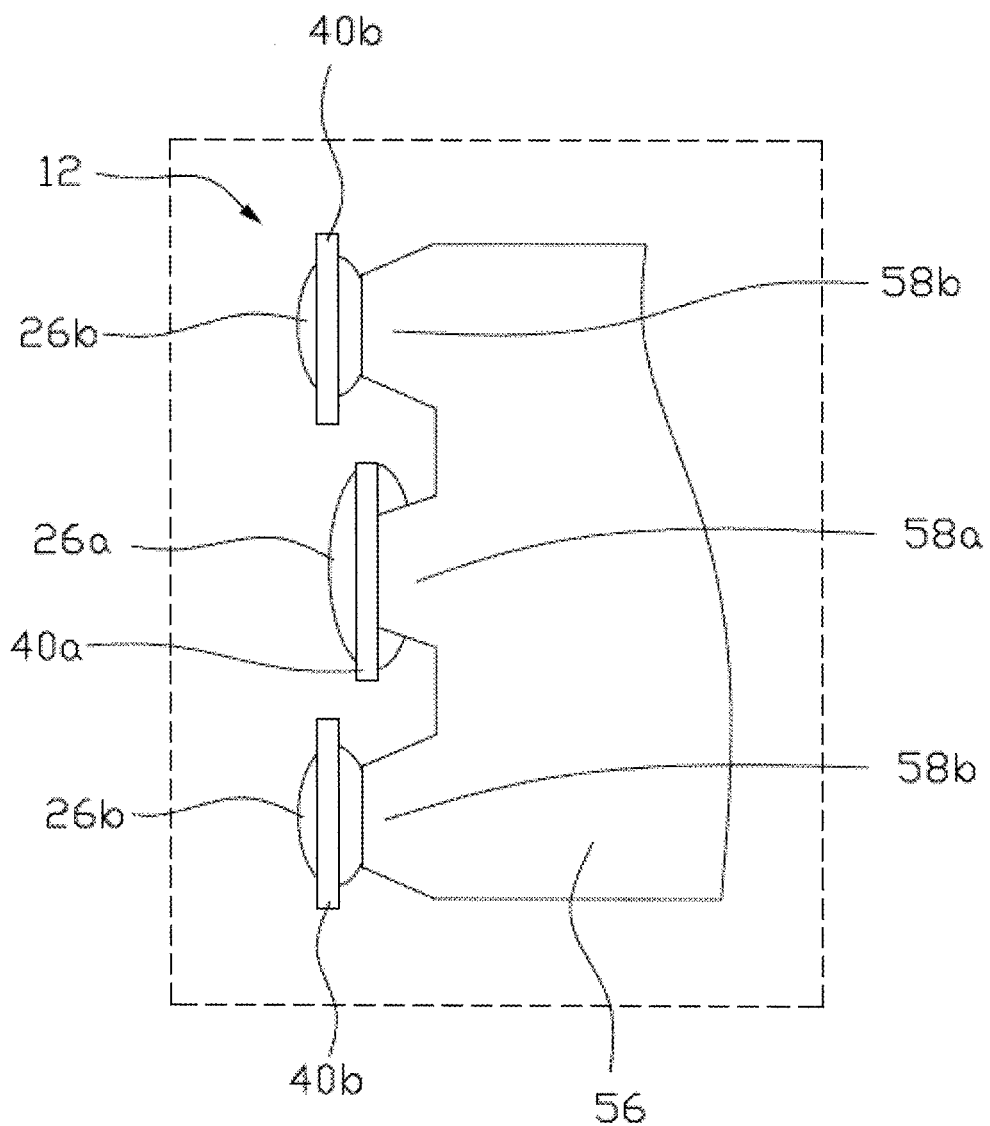
FIG. 4c shows an enlarged top representation of the area indicated by the dashed lines in FIG. 4b, illustrating the switch-arm engagement element of the actuation means of the electrical contactor in communication with the electrically-conductive moveable arm.

However, energisation of the solenoid 50 causes the plunger 52 to be retracted. The cam surface 54 is also retracted so as to present a wider surface to the sliding lifters 48, urging them towards the electrically-conductive moveable arms 24. The shape of the head 56 of each sliding lifter 48 is illustrated in FIG. 4c. The head 56 has a shaped surface, having a plurality of engagement protrusions 58a, 58b thereon. In the depicted embodiment, the outer engagement protrusions 58b project to a greater degree than the central engagement protrusion 58a. The central and outer engagement protrusions 58a, 58b respectively contact the lead and lag blades 40a, 40b of the electrically-conductive moveable arm 24.

As the sliding lifter 48 is actuated towards the electrically-conductive moveable arm 24, the outer engagement protrusions 58b contact with the lag blades 40b, forcing their moveable electrical contacts 26b out of contact with the corresponding fixed electrical contacts 26a. Subsequently, the central engagement protrusion 26a will contact with the lead blade 40a, forcing its moveable electrical contact 26b out of engagement with the corresponding fixed electrical contact 22. In doing so, the electrical communication between the first and second terminals 14, 16 is interrupted, as the electrically-conductive moveable aim 24 is displaced.

It is then in the re-closure of the electrical contact sets 28 which allows the present arrangement to illustrate its advantages over prior electrical contact switches. When the solenoid 50 is de-energised, the plunger 52 is expelled, and the sliding lifters 48 are allowed to retract inwardly. As the sliding lifters 48 retract the lead blade 40a on the electrically-conductive moveable arm 24 will move ahead of the lag blades 40b, such that contact is made between the lead moveable electrical contact 26a and fixed electrical contact 22 before contact is made between the lag moveable electrical contacts 26b and their corresponding fixed electrical contacts 22. This advantageously limits the propensity of the contacts 26a, 26b, 22 to arc or spark as they come into proximity with one another, which would otherwise have deleterious effects on the life expectancy of such contact sets 28.

As soon as contact is made between the lead moveable electrical contact 26a and the fixed electrical contact 22, current is able to pass through the electrically-conductive moveable arm 24. This current induces a magnetic field in each of the fixed and moveable steel plates 30, 32, which are attracted towards one another. This manifests as the moveable steel plate 32 moving with the electrically-conductive moveable arm 24 towards the fixed steel plate 30. Via the plate projection 36 on the moveable steel plate 32, a force proportional to the strength of the magnetic attraction is imparted to the electrically-conductive moveable arm 24, creating a greater contact closure force for the electrical contact set 28. Beneficially, this limits the likelihood of contact bounce, resulting in a more secure and accurately reproducible contact closure.

The positioning of the plate projection 36 on the plate body 34 is such that it is at a position of greatest magnetic interaction between the fixed and moveable steel plates 30, 32. In the depicted embodiment, this is somewhere between 60% and 70% of the length of the plate body 34, near to a point at which a free end of the fixed steel plate 30 corresponds vertically with the moveable steel plate 32.

Whilst this illustrated embodiment of the electrical contactor is shown having two electrical contact switches, each with a single moveable arm in a nominally vertical arrangement, it will be appreciated that a bi-armed arrangement could be provided. However, the present arrangement is advantageous in that the single moveable arm represents a significant reduction in the amount of copper required in order to fabricate the switch.

It is therefore possible to provide an electrical contact switch which results in significant reductions in the amount of contact bounce which occurs once the electrical contactor is operational. This is achieved by providing fixed and moveable ferromagnetic elements spaced about the moveable arm of the switch, the moveable arm inducing a magnetic field in the ferromagnetic elements upon closure. The two ferromagnetic elements are then attracted to one another to effect a greater contact closure force upon the moveable arm and therefore the contact set of the electrical contact switch.

The words 'comprises/comprising' and the words 'having/including' when used herein with reference to the present invention are used to specify the presence of stated features, integers, steps or components, but do not preclude the presence or addition of one or more other features, integers, steps, components or groups thereof.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The embodiments described above are provided by way of examples only, and various other modifications will be apparent to persons skilled in the field without departing from the scope of the invention as defined herein.

The invention claimed is:

1. An electrical contact switch for use in an electrical contactor, the electrical contact switch comprising:
   first and second electrical terminals;
   an electrically-conductive busbar in electrical communication with the first electrical terminal;
   at least one fixed electrical contact which is attached to the electrically-conductive busbar;
   an electrically-conductive moveable arm in electrical communication with the second electrical terminal;
   at least one moveable electrical contact which is attached to the electrically-conductive moveable arm to form an electrical contact set with the fixed electrical contact;
   a fixed ferromagnetic element positioned at or adjacent to a side of the electrically-conductive moveable arm proximate the second electrical terminal; and
   a moveable ferromagnetic element in physical communication with a side of the electrically-conductive moveable arm which is opposite to the fixed ferromagnetic element;
   wherein, in a closed condition of the electrical contact set, the electrically-conductive moveable arm induces a magnetic field in the fixed and moveable ferromagnetic elements, the moveable ferromagnetic element being magnetically attracted towards the fixed ferromagnetic element to thereby increase a contact pressure on the electrical contact set.

2. The electrical contact switch as claimed in claim 1, wherein the moveable ferromagnetic element includes a projection facing the electrically-conductive moveable arm to effect physical contact therebetween.

3. The electrical contact switch as claimed in claim 2, wherein the projection is positioned at or adjacent to a point on the moveable ferromagnetic element of maximum attraction to the fixed ferromagnetic element in the said closed condition of the electrical contact set.

4. The electrical contact switch as claimed in claim 1, wherein the moveable ferromagnetic element and/or fixed ferromagnetic element are formed as a steel plate.

5. The electrical contact switch as claimed in claim 1, wherein the electrically-conductive moveable arm is biased such that the or each moveable electrical contact is in contact with the or each fixed electrical contact in the absence of external forces.

6. The electrical contact switch as claimed in claim 1, wherein the electrically-conductive moveable arm is positioned at an acute angle to the fixed ferromagnetic element.

7. The electrical contact switch as claimed in claim 1, wherein the electrically-conductive moveable arm is positioned at an acute angle to a main body portion of the moveable ferromagnetic element.

8. The electrical contact switch as claimed in claim 1, wherein the electrically-conductive moveable arm has a split-blade arrangement, having at least two blades, each blade having one said moveable electrical contact thereon, the busbar having a corresponding plurality of fixed electrical contacts thereon.

9. The electrical contact switch as claimed in claim 8, wherein at least one of the said blades of the electrically-conductive moveable arm is a lead blade and at least one of the said blades of the electrically-conductive moveable arm is a lag blade, wherein the or each lead blade is adapted such that the moveable electrical contact associated therewith makes contact with the corresponding fixed electrical contact before the moveable electrical contact associated with the or each lag blade.

10. The electrical contact switch as claimed in claim 9, wherein the electrically-conductive moveable arm includes one said lead blade and two said lag blades.

11. An electrical contactor comprising:
at least one electrical contact switch, comprising:
first and second electrical terminals;
an electrically-conductive busbar in electrical communication with the first electrical terminal;
at least one fixed electrical contact which is attached to the electrically-conductive busbar;
an electrically-conductive moveable arm in electrical communication with the second electrical terminal;
at least one moveable electrical contact which is attached to the electrically-conductive moveable arm to form an electrical contact set with the fixed electrical contact;
a fixed ferromagnetic element positioned at or adjacent to a side of the electrically-conductive moveable arm proximate the second electrical terminal; and
a moveable ferromagnetic element in physical communication with a side of the electrically-conductive moveable arm which is opposite to the fixed ferromagnetic element;
wherein, in a closed condition of the electrical contact set, the electrically-conductive moveable arm induces a magnetic field in the fixed and moveable ferromagnetic elements, the moveable ferromagnetic element being magnetically attracted towards the fixed ferromagnetic element to thereby increase a contact pressure on the electrical contact set; and
an actuation means arranged to actuate the electrically-conductive moveable arm of the or each electrical contact switch between open and closed conditions.

12. The electrical contactor as claimed in claim 11, wherein the actuation means includes a switch-arm engagement element associated with the electrically-conductive moveable arm of the or each electrical contact switch, and an electromagnetically operable actuator to actuate the or each switch-arm engagement element.

13. The electrical contactor as claimed in claim 12, wherein the or each switch-arm engagement element has a shaped engagement surface to impart an actuation onto the or each electrically-conductive moveable arm.

14. The electrical contactor as claimed in claim 13, wherein the or each switch-arm engagement element is a sliding lifter having a plurality of engagement protrusions of different depth to form the shaped engagement surface.

15. The electrical contactor as claimed in claim 11, wherein the actuation means is a normally-closed actuation means.

16. A method of preventing or inhibiting contact bounce of an electrical contactor, the method comprising the steps of:
a] providing an electrical contact switch comprising:
first and second electrical terminals;
an electrically-conductive busbar in electrical communication with the first electrical terminal;
at least one fixed electrical contact which is attached to the electrically-conductive busbar;
an electrically-conductive moveable arm in electrical communication with the second electrical terminal;
at least one moveable electrical contact which is attached to the electrically-conductive moveable arm to form an electrical contact set with the fixed electrical contact;
a fixed ferromagnetic element positioned at or adjacent to a side of the electrically-conductive moveable arm proximate the second electrical terminal; and
a moveable ferromagnetic element in physical communication with a side of the electrically-conductive moveable arm which is opposite to the fixed ferromagnetic element;
b] actuating the electrically-conductive moveable arm such that the or each moveable electrical contact is brought into a closed condition with the fixed electrical contact; and
c] providing an electrical current through the electrically-conductive moveable arm so as to induce a magnetic field in the fixed and moveable ferromagnetic elements, such that the moveable ferromagnetic element is attracted towards the fixed ferromagnetic element, the moveable ferromagnetic element thereby applying a physical closure force to the electrically-conductive moveable arm to prevent or inhibit bouncing of the or each moveable electrical contact.

* * * * *